United States Patent [19]

Helmreich et al.

[11] Patent Number: 4,769,107
[45] Date of Patent: Sep. 6, 1988

[54] PROCESS AND APPARATUS FOR THE CYCLICAL MANUFACTURE OF SILICON SHAPED ARTICLES

[75] Inventors: Dieter Helmreich; Cord Gessert, both of Burghausen; Hans-Dieter Miller, Stammham; Helmut Zauhar, Burghausen, all of Fed. Rep. of Germany; Georg Priewasser, Ach, Austria; Leonhard Schmidhammer, Kirchheim/Tittmoning, Fed. Rep. of Germany

[73] Assignee: Heliotronic Forschungs- und Entwicklungsgesellschaft fur Solarzellen-Grundstoffe mbH, Burghausen, Fed. Rep. of Germany

[21] Appl. No.: 748,760

[22] Filed: Jun. 26, 1985

[30] Foreign Application Priority Data

Jul. 25, 1984 [DE] Fed. Rep. of Germany ....... 3427465

[51] Int. Cl.4 .......................... C30B 11/14; C30B 9/04
[52] U.S. Cl. .......................... 156/616.2; 156/DIG. 64; 164/122.2
[58] Field of Search ............... 156/616 R, DIG. 64, 156/616.2; 164/122.2

[56] References Cited

U.S. PATENT DOCUMENTS

| | | | |
|---|---|---|---|
| 3,567,526 | 3/1971 | Grell et al. | 156/616 R |
| 3,771,586 | 11/1973 | Waring | 164/122.2 |
| 4,175,610 | 11/1979 | Zauhar et al. | 164/60 |
| 4,312,700 | 1/1982 | Helmreich et al. | 156/616 R |
| 4,341,589 | 7/1982 | Grabmaier | 156/DIG. 64 |
| 4,382,838 | 5/1983 | Authier | 156/616 R |
| 4,561,930 | 12/1985 | Schwirtlich et al. | 156/616 R |
| 4,665,970 | 5/1987 | Ohno | 164/122.2 |

FOREIGN PATENT DOCUMENTS

| | | | |
|---|---|---|---|
| 2508803 | 9/1976 | Fed. Rep. of Germany | 156/616 R |
| 2302132 | 9/1976 | France | 156/DIG. 64 |

*Primary Examiner*—John Doll
*Assistant Examiner*—Lori S. Freeman
*Attorney, Agent, or Firm*—Collard, Roe & Galgano

[57] ABSTRACT

A process and apparatus for the manufacture of silicon blocks having a columnar structure comprising monocrystalline crystal zones having a crystallographic preferred orientation. In a casting process, each mold filled with molten silicon is transferred, before the silicon has solidified completely, to a separate crystallization station where the silicon can then crystallize completely. During this process, the exposed surface of the silicon is maintained in a molten state until the end of the solidification process has almost been reached. The process allows the various, necessary steps to be carried out simultaneously and yields high-quality solar cell base material.

5 Claims, 2 Drawing Sheets

PROCESS AND APPARATUS FOR THE CYCLICAL MANUFACTURE OF SILICON SHAPED ARTICLES

The invention relates to a process and apparatus for the cyclical manufacture of silicon shaped articles having a columnar structure comprising monocrystalline crystal zones which have a crystallographic preferred orientation. More particularly, it relates to such a process and apparatus in which the process molds are successively transported from a feed station to a casting station, filled with molten silicon, transferred to a cooling station after the directional solidification of the silicon and finally discharged.

As a solar cell base material, polycrystalline silicon having a columnar structure comprising monocrystalline crystal zones which have a crystallographic preferred orientation has become increasingly important in the production of electricity using photovoltaic techniques which can compete economically with conventional energy sources. This material which is known from U.S. Pat. No. 4,382,838 can be manufactured according to U.S. Pat. No. 4,175,610 using a semi-continuous casting process.

In this process, the molten silicon is poured within a casting station into a mold subjected to a vertical temperature gradient of from 200° to 1000° C. and it is then solidified. When the silicon has solidified completely, the mold is further cooled in a cooling station and when cool enough it is discharged. Simultaneously, another mold is transported from a feed station to the casting station and filled with molten silicon. This process which is efficient, per se, requires, however, relatively expensive heating equipment in the casting station for establishing the temperature gradient of the mold. In addition the casting station is unavailable for further process steps during the entire solidification process. Therefore, the production rate in installations operated according to this process can be raised only to a certain level, determined by the solidification speed of the silicon.

Accordingly, it is an object of the present invention, starting from this state of the art, to provide a novel process and apparatus that allows the cyclical casting of silicon shaped articles having a columnar structure with low equipment costs and increased production rates.

This object is achieved according to the present invention by a novel process wherein each mold entering the casting station from the feed station is brought to a temperature of from 20° to 1550° C. before the molten silicon is poured in. When the mold has been filled with silicon, and before the silicon has solidified completely, the mold is transferred to a crystallization station. In the crystallization station the silicon is subjected to directional solidification by means of directional energy removal. During this solidification procedure the exposed surface of the silicon is maintained in an at least partly molten state until near the end of the solidification process by supplying energy thereto. When the silicon has solidified completely in the crystallization station the mold is transported to a cooling station.

This and other related objects are also achieved according to the present invention by the provision of a novel apparatus for the cyclical manufacture of silicon shaped articles which includes a vacuum-tight casting station from which air can be evacuated, and that has a mold receiver which allows a mold to be moved into a casting position, as well as a melting crucible mounted within the casting station for melting silicon and for discharging the molten silicon to a mold disposed in the mold receiver; the melting crucible is surrounded by a heating device which allows the discharge of silicon from the melting crucible. The apparatus also includes at least one recharging channel that is separated from the external atmosphere by gates and leads to the melting crucible for supplying the same with silicon, and at least one crystallization station connected to the casting station, which crystallization station has means for supplying energy to an exposed surface of the silicon in a mold. The crystallization station also has means for removing energy disposed opposite to the means for supplying energy. A cooling station for cooling the silicon is connected to the crystallization station. At least one feed station for feeding empty molds to the casting station is provided. The feed station is separated from the crystallization station by means of vacuum-tight shut-off elements. Transport means are included for transporting the molds to and between the stations.

Other objects and features of the present invention will become apparent from the following detailed description when taken in connection with the accompanying drawings which disclose several embodiments of the invention. It is to be understood that the drawings are designed for the purpose of illustration only and are not intended as a definition of the limits of the invention.

BRIEF DESCRIPTION OF THE DRAWINGS

In the drawings, wherein similar reference characters denote similar elements throughout the several views.

Figure 1:
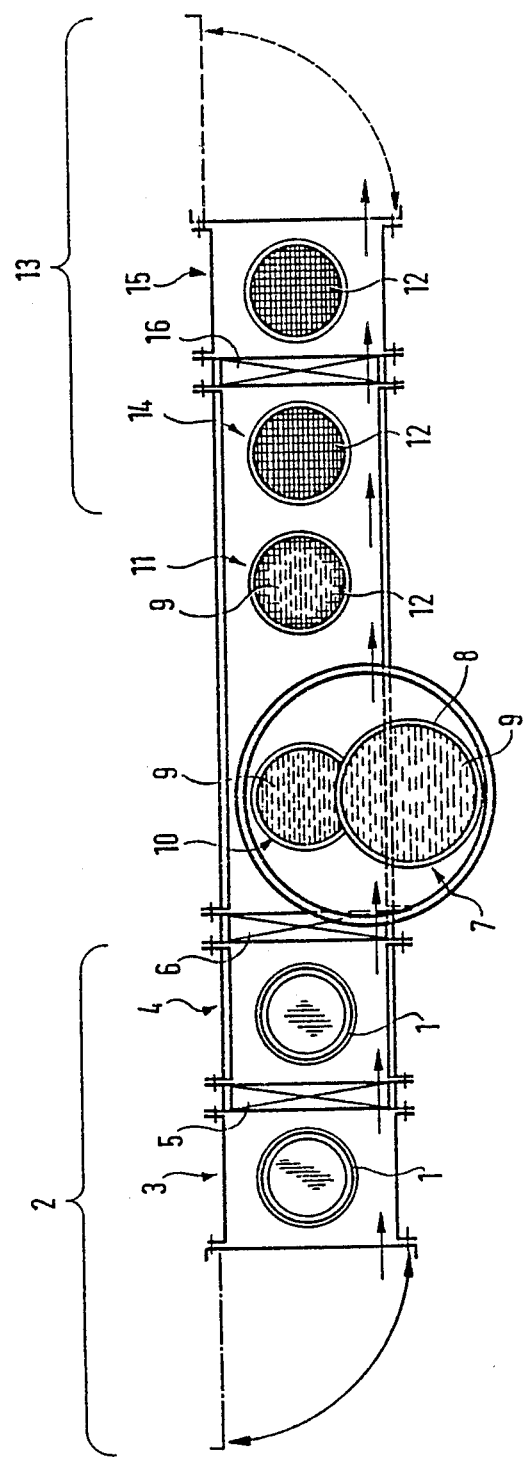
FIG. 1 is a diagrammatic plan view of a preferred embodiment of the apparatus for carrying out the process according to the invention.

Referring now in detail to the drawings, the molds 1 used in the process, which are shown only diagrammatically in the Figs., are known from the patent literature mentioned previously. They are usually hollow bodies that are in most cases open on one side, have a preferably rectangular internal cross-section and are made of silicon-resistant material, such as, for example, graphite, silicon nitride or silicon carbide. Their dimensions are determined by the amount of molten silicon to be accommodated. The internal measurements are advantageously chosen so that shaped articles having a rectangular or square cross-section of from 100 to 1100, preferably from 300 to 500 mm edge length are obtained from the solidified silicon, optionally, after the edge areas have been removed; the preferred target height of the product is advantageously from 150 to 250 mm. It has also proved useful to provide the mold surfaces that come into contact with silicon with linings or coatings, for example, of silicon, silicon carbide, silicon nitride, graphite, quartz or other suitable ceramic material. Molds that, when energy is supplied through the opening, essentially allow energy emission through the boundary surface opposite the opening are used to particular advantage. Therefore, the side surfaces of, for example, hollow cylinder-shaped molds advantageously have better heat insulation properties than the base surfaces.

In the process according to the invention, each empty mold 1 to be filled is introduced into a feed station 2. The feed station 2 is preferably divided into two sub-stations, namely, an insertion station 3 and a preheating station 4. The mold first enters the insertion station 3, where by means of the evacuation of air, or optionally with the admixture of an inert gas or inert gas mixtures, a suitable operating pressure is established, usually between $10^{-3}$ and $10^2$ mbar. The mold is then transferred to the preheating station 4 which is separated from the insertion station 3 by means of a shut-off element 5, which by way of example may be a vacuum slide valve. There the mold 1 is brought to the temperature desired for the casting process. The mold however, is first advantageously pre-dried at approximately from 150° to 350° C. It is then heated at approximately from 1400° to 2000° C., preferably from 1500° to 1600° C., to remove any remaining volatile impurities. This operation is advantageously carried out under a vacuum or an inert gas, for example, hydrogen, nitrogen or argon. The mold is then brought to the actual operating temperature of from 20° to 1500° C., preferably from 850° to 1350° C. The lower temperature range of from 20° to 850° C. is chosen mainly in those cases in which a particularly rapid cooling of the silicon is desired and molds of sufficiently temperature shock-resistant material are available. Mold temperatures above 1350° C., especially above the melting point of silicon are recommended, for example, when the cast silicon is to be maintained in a completely molten state. This would be applicable for example in an additional purifying operation by means of vacuum evaporation at from 1500° to 1700 ° C. (for example, according to U.S. Pat. No. 4,304,763) or by means of especially effective segregation of impurities in the direction of the melt surface during the crystallization process. In such cases it is generally necessary to use molds that are made of or lined or coated with an especially resistant material such as silicon nitride for example. Radiant heating elements arranged above the mold are advantageously used for preheating and heating. The elements are preferably made of graphite or silicon carbide. In principle however, other methods of heating, e.g., resistance or inductive heating, may also be considered.

After pretreatment, the mold is transferred from the feed station 2 to the casting station 7 which is separated from the feed station by a shut-off element, e.g., a vacuum slide valve 6. The pressure conditions should be the same in both stations during this transfer operation. In the casting station 7 there is a melting crucible 8 which is usually in the shape of a hollow cylinder. The melting crucible is advantageously in a raised position in relation to the mold. The crucible can be tilted according to a preferred embodiment of the invention in order to discharge the molten silicon 9 by pouring it out. The melting crucible, made of silicon-resistant material, preferably quartz, is advantageously heated directly using heating devices provided inside the casting station 7. The melting crucible is also preferably heated inductively by means of a second heating crucible that surrounds it. The heating crucible is made of electrically-conductive material, preferably graphite. It is arranged inside one or more induction coils and it can also be tilted in combination with the melting crucible. One or more electrically insulating and thermally insulating layers approximately from 10 to 200 mm thick are advantageously inserted between the heating crucible and the coil(s) in order to minimize heat loss. The melting crucible can also optionally be thermally insulated or heated from about and/or below, with the aid of tiltable heat insulating layers or radiant heaters. These radiant heaters are made, e.g., of suitably heated graphite or silicon carbide plates which are removable during recharging or casting.

Replacement of used or spent melting crucibles is occasionally necessary. To facilitate this replacement it has proved useful to provide the heating crucible with slightly conical side walls that widen from the bottom to the top and with a vertically movable base. The cooling station is advantageously provided with its own vacuum-tight means of access in its outer wall for the installation and removal of the melting crucibles.

The silicon to be introduced, usually in from granular to lump form (average granule size typically from approximately 1 to 150 mm), is fed into the melting crucible via a recharging channel. The recharging channel, usually in the shape of a duct, leads from a gate, via which the material to be melted can be brought into the casting station from outside, to a position above the opening of the melting crucible suitable for filling that crucible. Optionally, the recharging channel may be in the form of an oscillatable duct or it may be movable from an operating position taken during filling to a resting position taken during the melting process. The recharging channel may also have transport means that are charged outside the casting station and carry the material to be introduced via the gate, to the melting crucible where it is discharged thereinto.

It is advantageous to fill the melting crucible not in one step, but gradually in portions. This allows the dimensions of the recharging channel to be kept small and at the same time the melting crucible can be filled to a greater degree.

In principle, it is also possible to introduce the silicon into the melting crucible in molten form, for example, as a melt from previous purification processes, such as those described in U.S. Pat. 4,304,763 or DE-OS 27 29 464. In this case the molds may be filled directly, without the interposition of a melting crucible.

When recharging with solid silicon, the melting crucible is preferably maintained at temperatures of from 150° to 1600° C. In the case of quartz melting crucibles, temperatures of from 700° to 1500° C. are selected as experience has shown that in this range the material has increased resistance to mechanical stresses. If a charge is added to an already existing melt or to molten silicon, it has proved to be advantageous to adjust the amount introduced and the crucible temperature in a manner that prevents resolidification of the entire contents of the crucible. If the contents do resolidify entirely the crucible walls will be subjected to very high mechanical stresses due to the expansion of the silicon on solidification. If necessary, dopants can be added during the recharging process.

Usually a pressure of from 0.1 to 100 mbar, preferably from 1 to 20 mbar, is established in the casting station during the melting process. The use of inert gas is also beneficial, especially when supplied from above in the direction of the surface of the melt.

Shortly before or at the time the material in the melting crucible is completely melted, a mold 1 is transferred from the feed station 2 to the casting station 7. There it is put into the mold receiver 10 in order to be filled with the molten silicon. To avoid an excessive casting distance, the mold is generally brought closer to the point where the molten silicon 9 leaves the melting crucible 8. By way of example, a telescopic, rotatable shaft having a suitable supporting surface can be provided to assist in raising or lowering the mold. This may eliminate the need for additional aids such as hoppers or ducts, which would otherwise be necessary during the casting process.

During the casting process the molds are preferably rotated about their central longitudinal axes at approximately 10 to 60 revolutions per minute. This reduces the thermal and mechanical stress on the molds. At the same time a layer of solid silicon 12 forms within a short period on the contact surface between the mold wall and the silicon melt, therefore the remaining molten silicon 9 in the mold is in effect surrounded by a crucible of solid silicon. This technique minimizes the risk of impurities being formed by reaction between the crucible wall and the silicon melt.

Overheating of the mold by the hot melt when it is being poured in can be avoided by using (according to the ice-cube principle) so-called sacrificial pieces of silicon. The silicon "pieces" may be used to form the lining of the mold itself and thus undergo melting during the pouring process, thereby drawing heat from the melt.

When the molten silicon has been poured in and before it has solidified completely, the mold is removed from the mold receiver 10 and transferred to the crystallization station 11. The optimum time for this operation is when a complete crust of solidified silicon has formed on the surface of the melt as a result of the high degree of heat radiation. The solidified crust prevents the melt from spilling over when being transported and at the same time protects it against impurities.

In the crystallization station 11 this crust formed from the silicon itself is at least partially remelted. A complete remelting of the silicon 12 that has already solidified is in most cases unnecessary. A radiant heat source in the form of graphite or silicon carbide heating elements, for example is advantageously used as the energy source. It is arranged above the opening of the mold and radiates the energy onto the exposed surface of the silicon. Other heating techniques including resistance or induction heating can of course, also be used to heat the surface. The heating elements are preferably maintained at temperatures above the melting point of silicon and up to approximately 1600° C., preferably at from 1430° to 1480° C. To produce an almost vertically directed energy flow, and ultimately therefore almost vertically directed temperature gradients, the mold surface opposite the energy source, that is the base surface, is allowed to dissipate energy. One way this can be effected is by means of a heat exchange surface, for example graphite, copper, or iron, through which a liquid or gaseous coolant flows and which is brought into contact with the base of the mold. The removal of energy by cooling by means of cooling water, for example, is advantageously coordinated with the supply of energy in such a manner that a crystallization speed of from 0.1 to 5 mm/min, preferably from 1 to 2 mm/min, is obtained. As already explained, the development of an almost horizontal crystallization front can be assisted by thermally insulating the side portions of the mold.

During crystallization the exposed surface of the silicon is maintained in at least a partially molten state using the heaters until approximately from 80 to 95% of the total silicon has solidified. The temperature of the heating elements is then gradually reduced, preferably at a rate of from 0.1° to 10° C/min. Then the silicon on the exposed surface of the mold is thereby gradually caused to solidify also. This method prevents molten silicon from being enclosed by solidified silicon during the solidification process. As a result, thermally induced stresses, cracks or other mechanical damage in the product and/or the mold due to the increase in volume during solidification are prevented. The crystallization can also be beneficially influenced by rotating the mold about its vertical axis.

During crystallization, a vacuum or inert gas atmosphere preferably of approximately from 5 to 100 mbar is maintained in the crystallization station. Flowing a stream of inert gas over the surface of the melt removes any gaseous impurities present, such as silicon or carbon monoxide.

When the silicon has solidified completely, it is subjected to a tempering process that reduces any stresses in the material and at the same time renders uniform the temperature distribution. In principle, this step can also be carried out in the crystallization station 11. Preferably though the mold is transferred to a cooling station 13, which is connected to the crystallization station 11. This cooling station is advantageously divided into two sub-stations, a tempering station 14 and a fast-cooling station 15. The mold first enters the tempering station 14. A shut-off element between the tempering station 14 and the crystallization station 11 is not generally necessary. In the tempering station 14 the solidified silicon 12 is tempered to a temperature of from 900° to 1300° C., preferably at a cooling speed of from 0.5° to 30°0 C./min. During this stage, the silicon in the mold is generally no longer cooled from the base, while the energy being radiated onto its exposed surface is reduced by approximately 10 to 50% of the value used in the crystallization station. As in the crystallization station, the energy is supplied by means of suitable heat sources. Resistance or induction heating systems may be used, but radiant heaters made of graphite or silicon carbide heating elements, for example, are preferred.

When the required temperature has been reached. The temperature is preferably being maintained throughout the apparatus means of a pyrometer or other non-contact temperature measuring equipment-the mold is then transported to a fast-cooling station 15 which is separated from the tempering station 14 by a vacuum-tight shut-off element 16. There the solidified silicon is brought to pressure and temperature conditions under which it can finally be discharged from this station. When the silicon has cooled to a temperature of less than 700° C. it may be removed from the fast cooling station 15. This temperature threshold has proven to be useful, because when the silicon is less than 700° C. it is outside the temperature range of from 700° C. to 900° C. in which it is still plastically deformable. In addition, with the silicon below 700° C. the risk of the combustion of auxiliary devices made of graphite, such as the mold, when exposed to air or other oxidizing gases, is slight. Cooling is advantageously carried out using a stream of non-oxidizing gases, especially nitrogen or argon, which flows over the mold, and may optionally be circulated in the cooling station and cooled externally. In addition, the cooling effect can be increased by heat exchange surfaces which are in contact with the base of the mold and through which coolant flows. When the tempered mold was introduced into the fast-cooling station 15, the pressure in the fast cooling station 15 was set at approximately the same pressure which had been established in the tempering station 14. However, at the start of the fast-cooling operation, the pressure in the fast-cooling station can be raised to atmospheric pressure. In principle, the tempering and fast-cooling steps can also be carried out in a single station, but in that case a vacuum-tight element shutting off that station from the crystallization station is indispensible. When the threshold temperature of 700° C. has been reached, the fast-cooling station can be ventilated.

Figure 2:
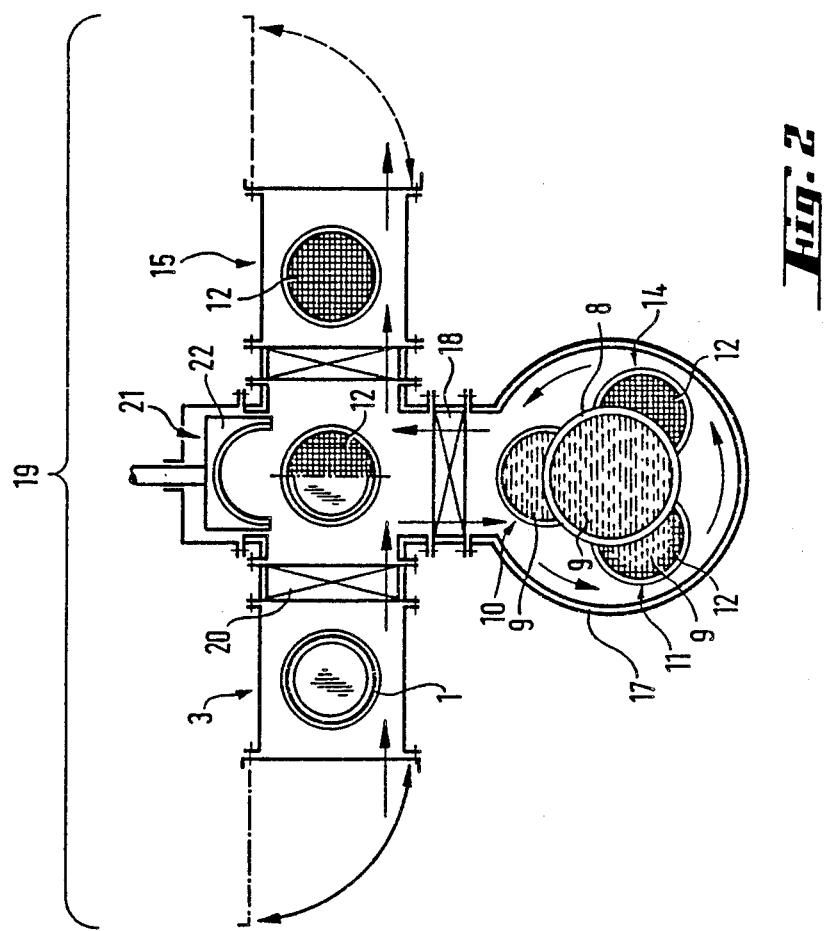
FIG. 2 is a diagrammatic view of a second preferred embodiment of such apparatus.

According to a preferred embodiment shown diagrammatically in FIG. 2, in an apparatus for carrying out the process according to the invention, the tiltable melting crucible 8 and recharging unit are arranged in a subjacent plane in a turntable-like configuration. The mold receiver 10, the crystallization station 11 and the tempering station 14, can also be situated together inside a single casting tower 17. The individual stations themselves have constructions analogous to the stations described in FIG. 1. The casting tower 17 is connected by a feed and discharge gate 18 to a charging and discharging line 19. There, the molds 1 first enter the insertion station 3 and then proceed to the forwarding station 21. The forwarding station 21 is separated from the insertion station by a vacuum-tight shut-off element 20. From there, on the one hand, empty molds can be introduced into the casting tower 17 and, on the other, molds filled with solidified silicon which have been discharged from the casting tower can be further transported to the fast-cooling station 15. In the case of empty molds, the forwarding station 21 performs the tasks of the preheating station (according to FIG. 1), specifically the establishment of the proper operating temperature and pressure. Full molds, on the other hand, are generally further transported to the fast-cooling station as quickly as possible so that they do not block the entry of the next empty mold into the forwarding station.

The supply or discharge of the molds into or out of the casting tower 17 may be achieved by using horizontally movable sliding forks 22, for example. The empty mold that has been introduced enters the mold receiver 10 and, in a method analogous to the one described in the first embodiment, the mold is raised to the position where the molten silicon 9 leaves the melting crucible 8 (usually by means of a telescopic rotatable shaft). When the mold has been filled, it is taken back to the starting position, and further transported to the next turntable position, i.e. the crystallization station, where the silicon solidifies directionally. The mold that is filled with already completely solidified silicon 12, and that may be in the crystallization station after the previous casting process, is simultaneously transferred to the tempering station 14 by the rotational movement. The mold that contains silicon tempered to from 900° to 1300° C. and that may be in the tempering station 14 reaches the mold receiver 10. It is then discharged from there to the forwarding station 21 and subsequently to the fast-cooling station 15. A new, empty, suitably prepared mold, when it has been through the forwarding station 21, can then occupy the free mold receiver 10 in the casting tower.

Of course, the apparatus represented in FIGS. 1 and 2 for carrying out the process according to the invention can be modified in many respects without departing from the inventive idea. This applies especially to apparatus in which several stations operating in parallel or in series are provided for the steps of the process that are the most time-consuming and, therefore, determine the speed. Thus, for example, variants having several feed, casting, crystallization, tempering or fast-cooling stations are possible. Accordingly, separating the casting and crystallization processes has a beneficial result.

The present process advantageously allows all the stations to be occupied by molds at the same time while the individual steps of the process are carried out in parallel. A preferred embodiment of the invention includes the following steps, carried out simultaneously: while solid silicon that has been charged into the melting crucible is caused to melt, a new mold is introduced into the insertion station and another is heated in the pre-heating station. At the same time, there is, in the crystallization station a mold containing solidified silicon; in the tempering station a mold the contents of which are being tempered to approximately from 900° to 1300° C.; and in the fast-cooling station another mold containing tempered silicon which is being brought to the removal conditions. When this last-mentioned mold has left the installation, all the molds can vacate the position they have heretofore occupied and can be moved to the next station. A heated mold is transported from the pre-heating station to the mold receiver, and it is filled therein with silicon that has in the meantime been melted. The mold then enters the crystallization station which was previously occupied by the mold that has been transferred to the tempering station. While crystallization is taking place, new silicon is melted in the melting crucible. During this process the mold receiver must remain free in the case of the arrangement according to FIG. 2, but it can be occupied in the case of the arrangement according to FIG. 1. In principle, however, this preferred simultaneous occupation of the stations can be dispensed with.

In order to transfer the molds to the desired stations, known transport means may be employed. For example transport slides, sliding forks or, in many cases, rotatable platforms may be used. An elegant solution to this transfer question is the use of lines of individually controllable rollers, which are started up as necessary and which provide the desired movement of the particular mold chosen. The use of conveyor belts requires that the process be carried out in a strictly synchronized manner, and is therefore less advantageous.

The silicon blocks obtained according to the process described herein have a columnar structure comprising monocrystalline crystal zones having a crystallographic preferred orientation. It is usually possible to obtain average grain sizes of from 0.3 to 100 mm, with typical grain sizes of from 1 to 30 mm. When the edge areas have been removed, the blocks constitute an excellent solar cell base material with which efficiency factors in the range of from 10 to 17% have been achieved. EXAMPLE In the installation shown in FIG. 2, a tiltable, induction-heated quartz melting crucible, (height approximately 600 mm, diameter approximately 500 mm, wall thickness approximately 8 mm) within a casting tower having water-cooled refined steel walls was almost completely filled, gradually and in portions (each approximately from 5 to 20 kg) with silicon lumps (particle size approximately 5-150 mm) by way of a recharging channel fitted with a tiltable shovel mechanism. After partial melting of this charge, new portions of silicon were added (each portion 5-20 kg) until a total or approximately 100 kg of silicon had been melted. During the melting process the crucible was kept within a temperature range of approximately from 1420° to 1480° C., and finally a melt temperature (measurement by pyrometer) of 1430° C. was established. In the receptacle, through which a stream of argon was passed in a downward direction, the pressure was 10 mbar.

At the same time, a hollow graphite cylinder having a square internal cross-section (internal height approximately 280 mm, internal edge length approximately 430 mm, outside diameter approximately 750 mm including the heat insulation of the side walls), and the inside of which was lined with approximately 6mm-thick plates of coursely crystalline highest grade silicon, which cylinder acted as the mold, was pushed into the insertion station of the charging and discharging line. The station was separated from the external atmosphere by a vacuum-tight flap. When the air had been removed and the operating pressure established (approximately from $10^{-1}$ to $10^{-3}$ mbar), the mold was further transported by means of a transport slide to the forwarding station of the charging and discharging line. The air in the forwarding station had already been removed and the forwarding station was separated from the insertion station by a water-cooled vacuum slide valve.

There the mold was maintained at approximately 250° C. for approximately 60 minutes, using a heated graphite radiant heating plate. The heating plate arranged above the mold was vacuum dried and shaped to correspond to the mold cross-section. The temperature of the heating element was then raised to approximately 1500° C. and the mold was heated for an additional 30 minutes. The temperature of the mold was subsequently reduced to approximately 1100° C. and an argon pressure of approximately 10 mbar, corresponding to the value in the casting tower, was established.

In the meantime, the silicon charged into the melting crucible had melted completely. At that point the mold was further transported from the forwarding station to the mold receiver of the casting tower by means of a sliding fork. This receiver, a graphite dish connected to a water-cooled telescopic rotatable shaft with additional heat insulation, was moved upwards until the intended casting position was reached. The melting crucible was then tilted and the molten silicon poured into the mold which was being rotated at approximately 10 rev/min.

When the mold was completely full, the melting crucible was tilted back into its starting position and could be recharged with solid silicon. The mold was moved back from the pouring position, while still being rotated, and left in the mold receiver until the surface of the silicon that had been poured in was covered with a thin layer of solidified silicon. At that point the mold was transferred to the crystallization station by means of the turntable.

There the exposed surface of the silicon was again almost completely melted from above using a graphite radiant heater (temperature approximately 1440° C.), while the mold base was cooled by means of a water-cooled copper plate. At a crystallization speed of approximately 1.0 mm/min, the silicon melt which was approximately 215 mm deep, had been completely crystallized after approximately 240 minutes. Towards the end of the crystallization process, that is when approximately 90% of the silicon present had solidified, the temperature of the radiant heater was reduced by approximately 0.5°/min until the exposed silicon surface also solidified. During crystallization the mold was rotated at approximately 10 rev/min, and in the final phase at approximately 1 rev/min. At the same time a light stream of argon was passed over the surface of the silicon.

The mold containing the completely solidified silicon was then further transported to the tempering station, using the turntable, and left there with the base no longer being cooled. The temperature of the radiant heater installed just above the opening of the mold was reduced at a rate of approximately 2.5°/min from the value set at the beginning, until it reached 1260° C., the final temperature in the crystallization station. Then the heater was switched off completely. After approximately 90 minutes the temperature in the mold had fallen to approximately 950° C. and the temperature distribution was uniform to a large degree.

The mold could now be discharged from the casting tower. For this purpose it was first transferred to the mold receiver using the turntable. From there the mold was conveyed to the forwarding station using the sliding fork, in preparation for further transporting from the forwarding station directly to the fast-cooling station of the charging and discharging line, by means of a transport slide. The cooling station was then flooded with argon and adjusted to atmospheric pressure. The argon atmosphere was then being constantly circulated and cooled by means of external heat exchangers. As a result, it was possible to reduce the temperature to less than 700° C. within approximately 150 minutes. The cooling devices were then switched off and the fast-cooling station opened. The mold was discharged and finally cooled in the air further until the silicon block was removed.

The resulting block was afterwards sawed up into individual blocks having a 10 ×10 cm cross-section. The blocks were then split up into wafers used as the actual starting material for solar cells. The solar cells obtained therefrom had efficiency factors in the range of 10–13%.

By the simultaneous occupation of the insertion station, the forwarding station (as a pre-heating station), the crystallization station, the tempering station and the fast-cooling station by empty or filled molds, and by the simultaneous melting of silicon in the melting crucible, the process could be carried out in such a manner that every four hours it would be possible to remove from the installation a mold containing a finished silicon block. The dwell times in the individual stations were adjusted to the most time-consuming individual step, usually the melting or crystallization process.

While only several embodiments and one example of the present invention have been described, it is obvious that many changes and modifications may be made thereunto, without departing from the spirit and scope of the invention.

What is claimed is:

1. A process for cyclical manufacture of silicon shaped articles as a solar cell base material having a columnar structure comprising monocrystalline crystal zones which have a crystallographic preferred orientation, comprising the steps of:
   successively transporting a multiplicity of separate molds from a feed station to a casting station;
   pre-heating each mold being introduced into the casting station to a temperature of from 20° to 1550° C.;
   filling each mold with molten silicon;
   transferring each filled mold to a crystallization station after at least the contact surface between the mold wall and the silicon melt is covered with a layer of solid silicon;
   subjecting the silicon contained in each filled mold at said crystallization station to directional solidification by means of directional energy emission and, during said solidification, maintaining the exposed surface of the silicon in an at least partially molten state until near the end of the solidification process by supplying energy thereto; and transferring each mold from said crystallization station to a cooling station when the silicon within each mold has completely solidified.

2. The process according to claim 1, additionally including the step of cyclically repeating the aforesaid steps in a timed sequence so that said feed station, said crystallization station and said cooling station are occupied by molds at the same time.

3. The process according to claim 1, additionally including the step of maintaining a crystallization speed of from 0.1 to 5 mm/min during the directional solidification of the silicon.

4. The process according to claim 1, additionally including the step of rotating each mold containing the solidified silicon, when said mold is in said crystallization station.

5. The process according to claim 1, additionally including the steps of tempering the solidified silicon from 900° to 1300° C. at a cooling rate of from 0.5° to 30° C./min, quickly cooling said solidified silicon to a temperature below 700° C. and subsequently exposing it to ambient pressure and temperature.

* * * * *